United States Patent
Sakuyama et al.

(10) Patent No.: US 10,062,658 B2
(45) Date of Patent: *Aug. 28, 2018

(54) ELECTRONIC COMPONENT AND ELECTRONIC DEVICE

(71) Applicant: FUJITSU LIMITED, Kawasaki-shi, Kanagawa (JP)

(72) Inventors: Seiki Sakuyama, Isehara (JP); Toshiya Akamatsu, Zama (JP); Nobuhiro Imaizumi, Atsugi (JP); Keisuke Uenishi, Suita (JP); Kenichi Yasaka, Suita (JP); Toru Sakai, Suita (JP)

(73) Assignee: FUJITSU LIMITED, Kawasaki (JP)

( * ) Notice: Subject to any disclaimer, the term of this patent is extended or adjusted under 35 U.S.C. 154(b) by 53 days.

This patent is subject to a terminal disclaimer.

(21) Appl. No.: 14/792,476

(22) Filed: Jul. 6, 2015

(65) Prior Publication Data

US 2015/0311171 A1 Oct. 29, 2015

Related U.S. Application Data

(62) Division of application No. 13/664,761, filed on Oct. 31, 2012, now Pat. No. 9,111,760.

(30) Foreign Application Priority Data

Dec. 26, 2011 (JP) .................. 2011-282725

(51) Int. Cl.
*H01L 23/00* (2006.01)
*H01L 23/498* (2006.01)
*H05K 3/34* (2006.01)

(52) U.S. Cl.
CPC ........ *H01L 24/16* (2013.01); *H01L 23/49811* (2013.01); *H01L 23/49838* (2013.01);
(Continued)

(58) Field of Classification Search
CPC ......... H01L 24/04; H01L 24/05; H01L 24/12; H01L 24/13; H01L 24/15; H01L 24/16;
(Continued)

(56) References Cited

U.S. PATENT DOCUMENTS 5,489,803 A 2/1996 Kanbe et al.
6,569,752 B1 5/2003 Homma et al.
(Continued)

FOREIGN PATENT DOCUMENTS

CN 102194783 A 9/2011
JP S56-056745 5/1981
(Continued)

OTHER PUBLICATIONS

Office Action of China Patent Application 201210429510.1 dated Feb. 16, 2015. Full translation of the Office Action.
(Continued)

*Primary Examiner* — Dimary Lopez Cruz
(74) *Attorney, Agent, or Firm* — Kratz, Quintos & Hanson, LLP

(57) ABSTRACT

A surface of at least one of a connection terminal of an electronic component and a connection terminal of a circuit board is covered with a protection layer made of a AgSn alloy. The connection terminal of the electronic component is soldered to the connection terminal of the circuit board.

11 Claims, 4 Drawing Sheets

(52) U.S. Cl.
CPC ........ *H01L 23/49866* (2013.01); *H01L 24/05* (2013.01); *H01L 24/13* (2013.01); *H01L 2224/0401* (2013.01); *H01L 2224/05023* (2013.01); *H01L 2224/05147* (2013.01); *H01L 2224/05564* (2013.01); *H01L 2224/05568* (2013.01); *H01L 2224/05639* (2013.01); *H01L 2224/13023* (2013.01); *H01L 2224/13111* (2013.01); *H01L 2224/16225* (2013.01); *H01L 2224/16227* (2013.01); *H01L 2224/16238* (2013.01); *H01L 2224/16503* (2013.01); *H01L 2224/16505* (2013.01); *H01L 2924/00014* (2013.01); *H05K 3/3436* (2013.01)

(58) Field of Classification Search
CPC . H01L 2224/05564; H01L 2224/05639; H01L 224/1311; H01L 2924/01047; H01L 2924/0105; H01L 23/49866; H01L 23/49579; H01L 23/52; H01L 24/03; H01L 24/10; H01L 24/11; H01L 24/28; H01L 24/29; H01L 24/30; H01L 23/498; H01L 23/5228; H01L 23/562
USPC ......... 174/250, 535; 361/760, 748; 257/734, 257/762, 737, 779, 781
See application file for complete search history.

(56) References Cited

U.S. PATENT DOCUMENTS

| | | | | |
|---|---|---|---|---|
| 7,196,356 | B2 | 3/2007 | Ishii et al. | |
| 7,223,695 | B2* | 5/2007 | Zhong et al. | .................. 438/687 |
| 7,705,436 | B2* | 4/2010 | Mahler | ............. H01L 23/49524 |
| | | | | 257/676 |
| 7,793,818 | B2 | 9/2010 | Tago et al. | |
| 8,338,287 | B2* | 12/2012 | Miura | .................. B23K 1/0016 |
| | | | | 438/614 |
| 8,348,139 | B2* | 1/2013 | Liu | ..................... B23K 35/0238 |
| | | | | 228/246 |
| 8,592,995 | B2* | 11/2013 | Lin | .................. H01L 23/49816 |
| | | | | 257/737 |
| 2006/0030139 | A1* | 2/2006 | Mis | ..................... H01L 21/2885 |
| | | | | 438/612 |
| 2007/0182006 | A1 | 8/2007 | Amagai | |
| 2008/0264165 | A1 | 10/2008 | Abe et al. | |
| 2008/0303144 | A1 | 12/2008 | Kasai et al. | |
| 2009/0085216 | A1 | 4/2009 | Tanaka et al. | |
| 2009/0126991 | A1 | 5/2009 | Hata et al. | |
| 2010/0032840 | A1 | 2/2010 | Amagai | |
| 2010/0183896 | A1 | 7/2010 | Liu et al. | |
| 2010/0291734 | A1 | 11/2010 | Amagai | |
| 2010/0319967 | A1* | 12/2010 | Amin et al. | .................. 174/257 |
| 2011/0057309 | A1 | 3/2011 | Kasai et al. | |
| 2011/0227219 | A1 | 9/2011 | Alvarado et al. | |

FOREIGN PATENT DOCUMENTS

| | | |
|---|---|---|
| JP | H10-41621 | 2/1998 |
| JP | 2000-260801 A | 9/2000 |
| JP | 2008-288297 A | 11/2008 |
| JP | 2009-054790 A | 3/2009 |
| JP | 2009-526382 A | 7/2009 |
| WO | 2007/092762 A2 | 8/2007 |

OTHER PUBLICATIONS

Office Action of Parent U.S. Appl. No. 13/664,761 dated Dec. 12, 2014.
Office Action of Parent U.S. Appl. No. 13/664,761 dated Jun. 23, 2014.
Office Action of corresponding Chinese Patent Application No. 201210429510.1 dated Jul. 23, 2015, with full translation.
Office Action dated Nov. 4, 2015 of U.S. Appl. No. 13/664,761, which is the parent of this application.
Japanese Office Action dated Mar. 1, 2016 for corresponding Japanese Patent Application No. 2011-282725, with partial translation of the Office Action.
Office Action dated May 17, 2016 for corresponding U.S. Appl. No. 13/664,761, which is the parent application of this application.
JP 2011-282725: Office Action dated Aug. 9, 2016.
U.S. Appl. No. 13/664,761: Office Action dated Aug. 10, 2016.
Arai, Susumu et al., Crystal Structure and Microstructure of Electrodeposited Sn—Ag Alloys, J. Japan Inst. Metals, vol. 60, No. 12 (1996), pp. 1149-1154 w/English Abstract.
Arai, Susumu et al., Crystal Structure and Microstructure of Electrodeposited Sn—Ag Alloys, J. Japan Inst. Metals, vol. 60, No. 12 (1996), pp. 1149-1154 w/English-language Abstract.
U.S. Appl. No. 13/664,761: Office Action dated Jan. 24, 2017.
Japanese Patent Application No. 2016-008085: Office Action dated Feb. 7, 2017.
U.S. Appl. No. 13/664,761: Office Action dated Jul. 25, 2017.

* cited by examiner

336 HOURS AFTER

1008 HOURS AFTER

336 HOURS AFTER

1008 HOURS AFTER

ELECTRONIC COMPONENT AND ELECTRONIC DEVICE

CROSS-REFERENCE TO RELATED APPLICATION

This application is based upon and claims the benefit of priority of the prior Japanese Patent Application No. 2011-282725, filed on Dec. 26, 2011, the entire contents of which are incorporated herein by reference.

FIELD

The embodiments discussed herein are related to an electronic component and an electronic device.

BACKGROUND

The number of connection terminals in a semiconductor device (an LSI: a large scale integrated circuit) has tended to increase in recent years along with advances in performance and integration of such a semiconductor device, and there is a growing demand for further reduction in size of connection terminals.

In flip-chip mounting, a connection terminal of a semiconductor device and a connection terminal of a wiring board are connected to each other by using a solder bump. Such a solder bump is made of an alloy (solder) such as Sn-3.5 wt % Ag, Sn-0.7 wt % Cu or Sn-3 wt % Ag-0.5 wt % Cu. In the meantime, the connection terminals of the semiconductor device and the wiring board are usually made of Cu (copper). Surfaces of the connection terminals may occasionally be plated with Ni (nickel) or Au (gold) in order to prevent corrosion or to improve solder wettability on the surfaces of the terminals.

[Patent Document 1] Japanese Laid-open Patent Publication No. 10-41621

SUMMARY

According to a first aspect of the disclosed techniques, an electronic component includes a connection terminal to be soldered to a different electronic component, in which a surface of the connection terminal is covered with a protection layer made of a AgSn alloy.

According to a second aspect of the disclosed techniques, an electronic device includes an electronic component; a circuit board having the electronic component mounted thereon; and solder bonding a connection terminal of the electronic component to a connection terminal of the circuit board, in which a surface of at least one of the connection terminal of the electronic component and the connection terminal of the circuit board is covered with a protection layer made of a AgSn alloy.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3A is a view depicting an example of an electronic component according to an embodiment while

DESCRIPTION OF EMBODIMENTS

Prior to description of embodiments, a prelude will be given below in order to facilitate understanding of the embodiments.

As described previously, in recent years, connection terminals of electronic components such as semiconductor devices have tended to be reduced in size and thus densities of currents (current densities) flowing through the connection terminals have tended to be increased. However, when a density of a current flowing through a connection terminal becomes equal to or above about $10^4$ A/cm$^2$, electromigration occurs at a junction between the connection terminal and solder, thereby increasing a resistance value between connection terminals. In an extreme case, such electromigration may result in a wiring disconnection.

Figure 1A:
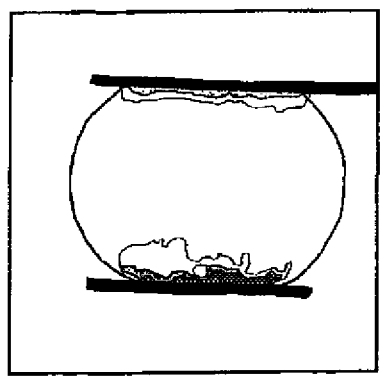
FIGS. 1A and 1B are views depicting results of investigating Cu distribution with time in the case of applying a current at a current density of $6 \times 10^{-3}$ A/cm$^2$ between connection terminals made of Cu under a temperature environment of 150° C.
Figure 1B:
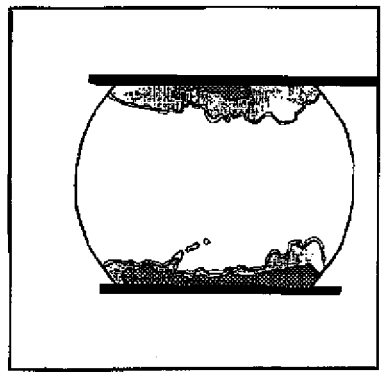

FIGS. 1A and 1B are views depicting results of investigating Cu distribution with time in the case of bonding connection terminals made of Cu to each other by using a solder bump and applying a current at a current density of $6 \times 10^{-3}$ A/cm$^2$ between the connection terminals under a temperature environment of 150° C. Here, a direct current flows from the upper connection terminal to the lower connection terminal. Note that an electron probe microanalyzer (EPMA) is used for acquisition of the Cu distribution.

As apparent from FIGS. 1A and 1B, Cu atoms contained in the connection terminals migrate from below (a low-potential side) to above (a high-potential side) with time. A position after migration of a Cu atom constitutes an atomic vacancy. When a number of such atomic vacancies are generated, such vacancies may be collectively recognized as electromigration.

Figure 2A:
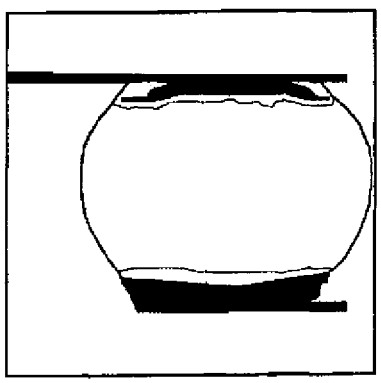
FIGS. 2A and 2B are views depicting results of investigating Ni distribution with time under similar conditions to those used in FIGS. 1A and 1B with surfaces of the connection terminals plated with Ni.
Figure 2B:
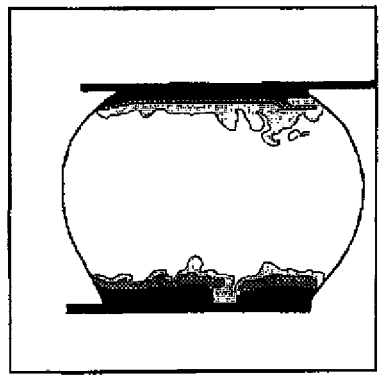

FIGS. 2A and 2B are views depicting results of investigating Ni distribution with time under similar conditions to those used in FIGS. 1A and 1B with surfaces of the connection terminals plated with Ni. As apparent from FIGS. 2A and 2B, Ni atoms migrate from below to above with time. Therefore, Ni plating does not prevent the electromigration.

A conceivable option to suppress such electromigration is to increase the number of connection terminals and to thereby reduce a current density in each of the connection terminals. However, this leads to an increase in a layout space for the connection terminals, which results in an increase in size of a semiconductor device.

In view of the above, an object of the embodiments is to provide an electronic component and an electronic device, which are less likely to cause electromigration even when a current having a high current density flows through a junction between a connection terminal and solder.

EMBODIMENT

Figure 3A:
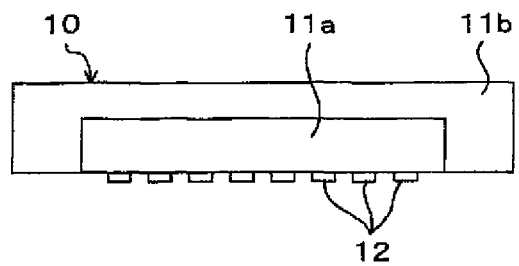
Figure 3B:
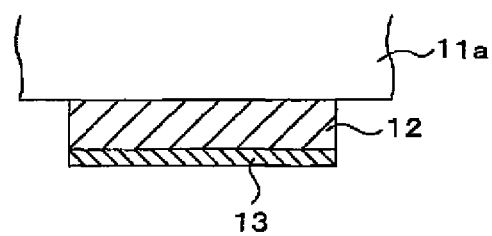
FIG. 3B is an enlarged view depicting a portion of a connection terminal of the electronic component.
Figure 4:
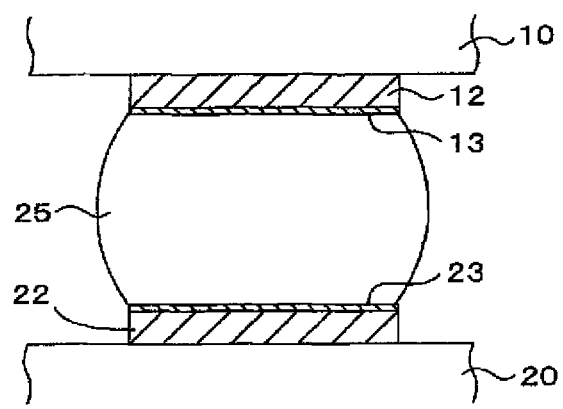
FIG. 4 is a view depicting a junction between a connection terminal of the electronic component and a connection terminal of a circuit board.

FIG. 3A is a view depicting an example of an electronic component according to an embodiment and FIG. 3B is an enlarged view depicting a portion of a connection terminal of the electronic component. Meanwhile, FIG. 4 is a view depicting a junction between a connection terminal of the electronic component and a connection terminal of a circuit board.

An electronic component 10 according to the embodiment includes a semiconductor chip 11a provided with a given electronic circuit, and a package (sealing resin) 1ib which seals the semiconductor chip 11a. Meanwhile, a number of connection terminals 12 are provided on a lower surface side of the semiconductor chip 11a. The connection terminals 12 are made of Cu and a protection layer 13 made of a AgSn (silver-tin) alloy is provided on each surface of the connection terminals 12.

Here, chemically stable AgSn is preferably used for the AgSn alloy to form the protection layer 13.

A thickness of the protection layer 13 is preferably from 3 μm to 100 μm. If the thickness of the protection layer 13 falls below 3 μm, such a protection layer 13 may contain a pin hole. This makes it difficult to completely cover a Cu electrode and thus Cu electromigration is not prevented sufficiently. On the other hand, if the thickness of the protection layer 13 exceeds 100 μm, such a protection layer 13 may reduce electric conductivity and adversely affect the electronic circuit.

Meanwhile, a circuit board 20 includes wiring (not depicted) formed into a given pattern, and connection terminals 22 (see FIG. 4). Each connection terminal 22 of the circuit board 20 is also made of Cu and a protection layer 23 made of an AgSn alloy is provided on a surface thereof. In addition, the connection terminal 12 of the electronic component 10 is bonded to the connection terminal 22 of the circuit board 20 by using solder 25. The solder 25 is made of a Sn-3.5 wt % Ag alloy, for example.

In this embodiment, the surfaces of the connection terminals 12 and 22 are covered with the protection layers 13 and 23 each made of a AgSn alloy as described above. Thus, electromigration may be suppressed. Reasons why the prevention is available will be described below.

Electromigration has a relation with a diffusion coefficient. To be more precise, an element having a greater diffusion coefficient is more likely to cause electromigration. The diffusion coefficient of Cu in Sn is equal to $2.4 \times 10^{-11}$ m$^2$/s while the diffusion coefficient of Ni in Sn is equal to $5.4 \times 10^{-13}$ m$^2$/s at 160° C. On the other hand, the diffusion coefficient of Ag in Sn is equal to $9.0 \times 10^{-15}$ m$^2$/s, which is smaller by four digits than that of Cu and by two digits than that of Ni. In other words, Ag in Sn is less likely to migrate upon application of a high-density current and less likely to generate atomic vacancies, which lead to electromigration, as compared to Cu or Ni.

Meanwhile, Sn in Ag has the diffusion coefficient which is almost the same as that of Ag. Moreover, since Sn is solid-solved in Ag in a temperature range equal to or below 160° C. For these reasons, an atomic vacancy generated by migration of Ag attributed to the current flowing between the contact terminals is buried with Sn. Accordingly, electromigration is even less likely to occur in this case.

As described above, in this embodiment, the surfaces of the connection terminals 12 and 22 are covered with the protection layers 13 and 23 each made of the AgSn alloy. Accordingly, even when the current flowing between the connection terminals 12 and 22 has a high current density, migration of the Cu atoms in the connection terminals 12 and 22 and migration of the Ag atoms in the protection layers 13 and 23 are suppressed, whereby electromigration is less likely to occur. In this way, problems such as an increase in a resistance value attributed to electromigration and occurrence of a wiring disconnection are avoided. As a consequence, the embodiment has an effect of improving reliability of a junction between the electronic component 10 and the circuit board 20.

As apparent from FIGS. 1A, 1B, 2A, and 2B, migration of the atoms attributed to electromigration occurs in the direction from the low-potential side (a cathode) to the high-potential side (an anode). Accordingly, the protection layer may only be provided on the connection terminals on the low-potential side without providing the protection layer on the connection terminals on the high-potential side.

Moreover, the solder 25 connecting the connection terminals 12 and 22 is not limited to the above-mentioned Sn-3.5 wt % Ag alloy but various other alloys (solder) including a Sn-0.7 wt % Cu alloy, a Sn-3 wt % Ag-0.5 wt % Cu alloy may be also applied.

Nevertheless, the solder 25 connecting between the connection terminals 12 and 22 is preferably made of an SnAg alloy containing Ag in a range from 2.0 wt % to 4.0 wt %. When the above-described SnAg alloy is used as the solder, this alloy has an effect of suppressing diffusion of the AgSn alloy in the protection layers 13 and 23 into the solder. Thus, a wiring disconnection between the connection terminals 12 and 22 attributable to electromigration may be suppressed more reliably.

Experiment 1

Some electronic components and circuit boards are soldered in accordance with the above-described method and then time to cause a wiring disconnection due to electromigration is investigated for each of the combinations of the electronic components and the circuit boards. Results are described below.

A pair of copper patterns each having a width of 100 μm and a height of 100 μm are formed on a glass epoxy substrate in such a manner that end surfaces of the patterns are opposed to each other. Then, the end surface of each of the copper patterns is plated with Ag in a thickness of 3 μm and is further plated with Sn in a thickness of 0.5 μm. Thereafter, the glass epoxy substrate is heated to a temperature of 250° C. to cause mutual diffusion of Ag and Sn, thereby forming protection layers containing Ag$_3$Sn as a chief component. Then, a sample of Example is prepared by bonding the protection layers to each other using the Sn-3.5 wt % Ag alloy (the solder).

Figure 5A:
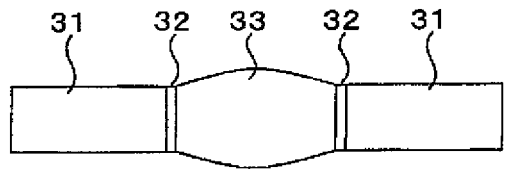
FIGS. 5A to 5C are views schematically depicting samples of Example and Comparative Examples 1 and 2.

FIG. 5A is a view schematically depicting the sample of Example, in which reference numeral 31 denotes the copper pattern, reference numeral 32 denotes the protection layer (Ag$_3$Sn), and reference numeral 33 denotes the solder (Sn-3.5 wt % Ag).

Figure 5B:
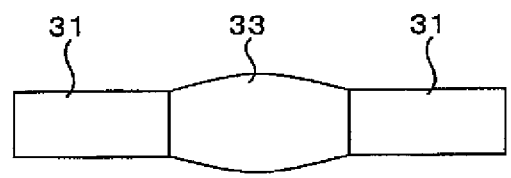
Figure 5C:
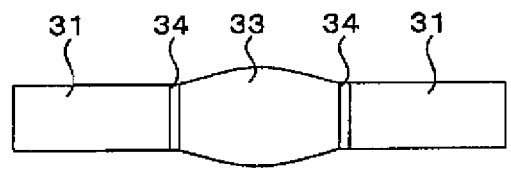

Meanwhile, as depicted in FIG. 5B, a sample similar to Example except that no protection layers 32 are provided is prepared as Comparative Example 1. Further, as depicted in FIG. 5C, a sample similar to Example except that Ni-plated layers 34 each having a thickness of 13 μm to 16 μm are formed instead of the protection layers 32 is prepared as Comparative Example 2.

In order to achieve uniform shapes of solder bonded portions, a resist film is formed so as to prevent the solder from adhering to portions other than the end surfaces of the copper patterns 31. In addition, a plurality of samples are prepared for each of Example and Comparative Examples 1 and 2.

Next, the samples of Example and Comparative Examples 1 and 2 are immersed in an oil bath maintained at a temperature of 160° C. in order to reduce temperature variations due to Joule heating associated with changes in resistance. Then, a direct current is applied from a constant current regulator to the samples of Example and Comparative Examples 1 and 2 in such a condition that a current density at a bonded interface between the solder and the copper pattern is equal to $2.5 \times 10^4$ A/cm$^2$. Then, time to cause a wiring disconnection due to electromigration is measured for each of the samples.

Figure 6:
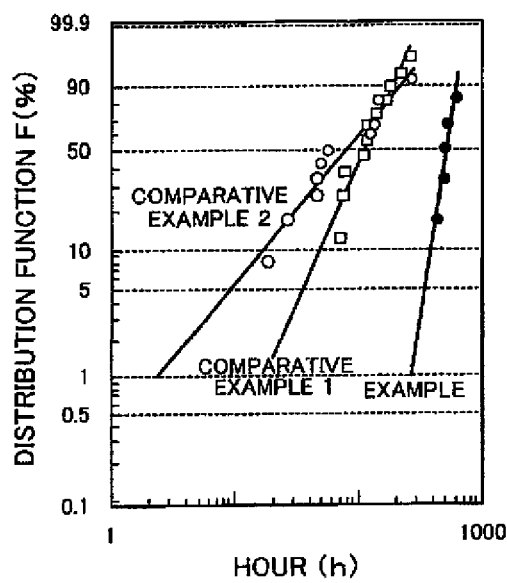
FIG. 6 is a graph illustrating results of investigation of time to cause wiring disconnections in the samples of Example and Comparative examples 1 and 2.

FIG. 6 is a graph illustrating results of investigation of the time to cause wiring disconnections in the samples of Example and Comparative Examples 1 and 2. In this graph, the horizontal axis indicates the time to cause a wiring disconnection (fracture lifetime) and the vertical axis indicates a distribution function F. As apparent from FIG. 6, the fracture lifetime of the samples of Example is about three times as long as the fracture lifetime of the samples of Comparative Example 1 and about six times as long as the fracture lifetime of the samples of Comparative Example 2. The results of this experiment prove effectiveness of the embodiment.

In the above-described experiment, the end surfaces of the copper patterns are sequentially plated with Ag and Sn and are then subjected to thermal treatment to form the AgSn alloy. Nevertheless, similar results are also achieved in the case where the end surfaces of the copper patterns are directly plated with the AgSn alloy.

Experiment 2

An experiment is conducted for investigating relations between Ag contents in the protection layers and time to cause wiring disconnections due to electromigration. Results are described below.

Samples similar to the sample of Example in the above-described Experiment 1 (see FIG. 5A) are prepared by setting various Ag contents in the protection layers covering the end surfaces of the copper patterns. Then, a direct current at a current density of $2.5 \times 10^4$ A/cm$^2$ is applied to each of the samples as similar to the procedures used for the samples of Example in Experiment 1. Then, time to cause a wiring disconnection is measured for each of the samples.

Figure 7:
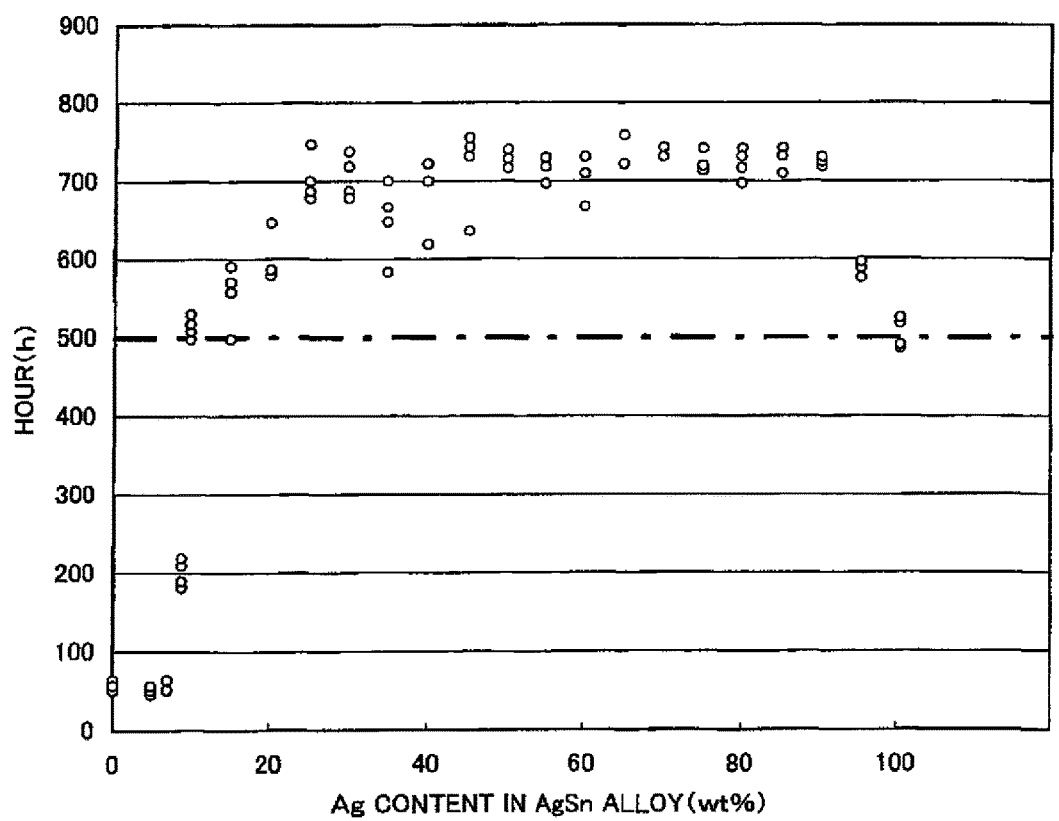
FIG. 7 is a graph illustrating results of investigation of relations between Ag contents in AgSn alloys and time to cause wiring disconnections.

FIG. 7 is a graph illustrating results of investigation of relations between the Ag contents in the AgSn alloys and the time to cause wiring disconnections (fracture lifetime), in which the horizontal axis indicates the Ag contents in the AgSn alloys while the vertical axis indicates the time. As apparent from FIG. 7, the fracture lifetime is equal to or below 500 hours when the Ag content falls below 5 wt % or exceeds 95 wt %. The results of this experiment prove that the Ag content in each protection layer is preferably in a range from 10 wt % to 95 wt % inclusive.

In the embodiment, the description has been given of the case where the electronic components are the semiconductor device (an LSI) and the circuit board. Needless to say, the techniques disclosed above may be also applied to electronic components other than the semiconductor device, such as a chip resistor element or a capacitor element. In addition, though the description has been given of the case of bonding the semiconductor device to the circuit board in the embodiment, the embodiment may be also applied to a case of soldering semiconductor devices to each other.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

We claim:

1. An electronic component comprising:
a connection terminal to be soldered to a semiconductor device with solder made of an alloy of Ag and Sn, the connection terminal made of Cu; and
a protection layer made of a AgSn alloy of only Ag and Sn, with which a surface of the connection terminal before being soldered to the semiconductor device is directly covered, the protection layer on which the solder is mounted, wherein
a Ag content in the solder is equal to or above 2.0 wt % and equal to or below 4.0 wt %, and
a Ag content in the protection layer is equal to or above 10 wt % and equal to or below 95 wt %.

2. The electronic component according to claim 1, wherein the AgSn alloy is Ag$_3$Sn.

3. The electronic component according to claim 1, wherein the surface of the connection terminal, that is directly covered with the protection layer, directly contacts the protection layer.

4. An electronic device comprising:
a semiconductor device;
a first connection terminal of the semiconductor device, the first connection terminal made of Cu;
a circuit board having the semiconductor device;
a second connection terminal of the circuit board, the second connection terminal made of Cu;
a solder made of an alloy of Ag and Sn;
a protection layer made of a AgSn alloy of only Ag and Sn, with which a surface of at least one of the first connection terminal and the second connection terminal before being bonded to each other with the solder is directly covered; and
the solder bonding the first connection terminal to the second connection terminal, the solder that is mounted on the protection layer, wherein
a Ag content in the protection layer is equal to or above 10 wt % and equal to or below 95 wt %, and
a Ag content in the solder is equal to or above 2.0 wt % and equal to or below 4.0 wt %.

5. The electronic device according to claim 4, wherein the AgSn alloy is Ag$_3$Sn.

6. The electronic device according to claim 4, wherein a current flowing between the connection terminal of the semiconductor device and the connection terminal of the circuit board has a current density equal to or above $10^4$ A/cm$^2$.

7. The electronic device according to claim 4, wherein the protection layer is provided only on the connection terminal on a low-potential side out of the connection terminal of the semiconductor device and the connection terminal of the circuit board.

8. The electronic device according to claim 4, wherein the surface of at least the one of the first connection terminal and the second connection terminal, that is directly covered with the protection layer directly contacts the protection layer.

9. A semiconductor device comprising:
- a connection terminal to be soldered to a different electronic component with solder made of an alloy of Ag and Sn, the connection terminal made of Cu; and
- a protection layer made of a AgSn alloy of only Ag and Sn, with which a surface of the connection terminal is directly covered, the protection layer on which the solder is mounted, wherein
- a Ag content in the solder is equal to or above 2.0 wt % and equal to or below 4.0 wt %, and
- a Ag content in the protection layer is equal to or above 10 wt % and equal to or below 95 wt %.

10. The semiconductor device according to claim 9, wherein the AgSn alloy is $Ag_3Sn$.

11. The semiconductor device according to claim 9, wherein the surface of the connection terminal, that is directly covered with the protection layer directly contacts the protection layer.

* * * * *